United States Patent
Nishizawa et al.

[11] Patent Number: 5,907,156
[45] Date of Patent: May 25, 1999

[54] WIDE RANGE RADIATION DETECTOR

[75] Inventors: Hiroshi Nishizawa; Kazunori Ikegami, both of Tokyo, Japan

[73] Assignee: Mitsubishi Denki Kabushiki Kaisha, Tokyo, Japan

[21] Appl. No.: 08/940,994

[22] Filed: Sep. 30, 1997

Related U.S. Application Data

[63] Continuation of application No. 08/598,519, Feb. 8, 1996, abandoned.

[30] Foreign Application Priority Data

Mar. 22, 1995 [JP] Japan .................................. 7-063076
Sep. 8, 1995 [JP] Japan .................................. 7-231423

[51] Int. Cl.$^6$ .......................................... H01G 31/0352
[52] U.S. Cl. ............................. 250/370.01; 250/370.06; 250/370.1; 250/394
[58] Field of Search .................. 250/370.01, 370.06, 250/370.1, 370.14, 394

[56] References Cited

U.S. PATENT DOCUMENTS

| | | | |
|---|---|---|---|
| 2,847,585 | 8/1958 | Christian | 250/370.01 X |
| 3,129,329 | 4/1964 | Love et al. | 250/370.06 X |
| 3,548,213 | 12/1970 | Owen et al. | 250/370.1 |
| 4,445,036 | 4/1984 | Selph | 250/370.06 X |
| 4,891,521 | 1/1990 | Danos | 250/370.1 X |
| 5,059,786 | 10/1991 | Chu | 250/370.06 X |
| 5,245,191 | 9/1993 | Barber et al. | |

FOREIGN PATENT DOCUMENTS

| | | |
|---|---|---|
| 0527373 | 2/1993 | European Pat. Off. . |
| 0642178 | 3/1995 | European Pat. Off. . |
| 63-182870 | 7/1988 | Japan .................. 250/370.06 |
| 6-137943 | 5/1994 | Japan .................. 250/338.4 |

OTHER PUBLICATIONS

Eube et al., "A 'Five–In–One' GE(L1) Spectrometer as Compton Polarimeter", Nuclear Instruments & Methods 130, No. 1, Dec. 1995, pp. 73–77.

"Metal/Amorphous Silicon Multilayer Radiation Detectors", Yujiro Naruse et al., IEEE Transactions on Nuclear Science, vol. 36, No. 2, Apr. 1989, pp. 1347–1352.

Patent Abstracts of Japan, "Radiation Measuring Instrument", Kawasaki Satoshi.

A 90 element CdTe array detector, by Y. Iwase, M. Funaki, A. Onozuka and M. Ohmori, Nuclear Instruments and Methods in Physics Research A322 (1992) 628–632.

Design and Performance of an 7 cm Thick Intrinsic Germanium Detector Telescope, by R. Eisberg, M. Makino, R. Cole, C.N. Waddell, M. Baker, J.J. Jarmer, D.M. Lee and P. Thomson, Nuclear Instruments and Methods 146 (1977) 487–495.

*Primary Examiner*—Constantine Hannaher
*Attorney, Agent, or Firm*—Sughrue, Mion, Zinn, Macpeak & Seas, PLLC

[57] ABSTRACT

A wide range radiation detector which can precisely detect high energy region radiations. The detector has a plurality of layered semiconductor elements wired in parallel, and outputs the energy of the radiation by summing the charges generated by ionization of the radiation incident on the semiconductor elements.

10 Claims, 11 Drawing Sheets

WIDE RANGE RADIATION DETECTOR

This is a Continuation of application Ser. No. 08/598,519 filed Feb. 8, 1996, now abandoned.

BACKGROUND OF THE INVENTION

1. Field of the Invention

This invention relates to a wide range radiation detector for detecting radiations in wide range energy regions, and more particularly relates to a radiation detector for detecting radiations in high energy regions highly sensitively.

2. Description of the Prior Art

FIG. 21 is a block diagram showing a construction of a conventional wide range radiation detector. In the figure, reference numeral 1 designates a semiconductor element. Reference numerals 2, 3 and 4 designate radiations incident on the semiconductor element 1. Reference numeral 5 designates a preamplifier for taking out and amplifying output pulses having pulse heights proportional to the energy of radiations absorbed in the semiconductor element 1. Reference numeral 6 designates a main amplifier connected to the preamplifier 5. Reference numeral 7 designates an analog-digital converter connected to the main amplifier 6. Reference numeral 8 designates a multi-channel pulse height analyzer connected to the analog-digital converter 7.

Next, the operation of the wide range radiation detector structured as above will be described. At first, the radiations 2, 3 and 4 enter the semiconductor element 1. Then, the whole energy of the radiation 2 is absorbed in the semiconductor element 1; the radiation 3 passes through the semiconductor element 1 without any interaction; the radiation 4 causes, for example, Compton scattering in the semiconductor element 1, so that the energy of the radiation 4a is absorbed and the energy of the radiation 4b is emitted to the outside of the element 1 without being absorbed.

Consequently, only the output pulses having pulse heights proportional to the energy of the radiations 2 and 4a are outputted from the semiconductor element 1. Then, the output pulses are amplified by the preamplifier 5 and the main amplifier 6 to be converted from analog signals to digital signals by the analog-digital converter 7. And further, the converted digital signals are counted by the multi-channel pulse height analyzer 8 by every pulse height value. Thus, the energy distributions and the dose rates of the radiations incident on the semiconductor element 1 are measured on the basis of the results of the analysis of the multi-channel pulse height analyzer 8.

Since the conventional wide range radiation detector is structured as above, high energy region radiations cannot be detected accurately because they pass through without any interaction like the radiation 3 or cause Compton scattering and so forth like the radiation 4 so that the whole energy of them are not absorbed but a part of the energy of them is emitted to the outside of the semiconductor element 1. Accordingly, the followings can be considered for resolving the above problem. At first, it is considerable to cope with high energy region radiations by increasing the thickness of the semiconductor element 1 itself. But it is very difficult to form the thickness of the semiconductor element 1 up to an extent capable of coping with the high energy region radiations by means of traditional semiconductor manufacturing skills. Alternately, it is also possible to cope with the high energy region radiations by increasing the area of the semiconductor element 1 itself and disposing the longer side of the element 1 in parallel with the incident directions of the radiations. But the plan can not be adopted in spite of the capability for detecting the high energy region radiations, because the part of the semiconductor element 1 for detecting radiations would be very narrow owing to the thin thickness direction of the element 1 to be disposed parallel to the incident thereof. Another problem of the plan is that the whole energy given to the element by radiations cannot be transmitted to outer circuits in the case of semiconductors whose mobility of charge carriers is small. The reason is that the collection of charges becomes insufficient because some generated charges cannot reach collection electrodes owing to the small mobility of charge carriers.

SUMMARY OF THE INVENTION

In view of the foregoing, it is the object of the present invention to provide a wide range radiation detector capable of detecting radiations highly sensitively.

According to the first aspect of the present invention, for achieving the above-mentioned object, there is provided a wide range radiation detector including a detection part of radiations having a semiconductor element provided with an anode electrode and a cathode electrode for absorbing energy of incident radiations to output electric signals, which detection part is composed of a plurality of layered semiconductor elements.

According to the second aspect of the present invention, there is provided a wide range radiation detector whose detection part is composed of a plurality of semiconductor elements layered on each other through an insulating membrane.

According to the third aspect of the present invention, there is provided a wide range radiation detector which comprises an absorption material for absorbing low energy radiations in a traveling path of radiations into the detection part thereof.

According to the fourth aspect of the present invention, there is provided a wide range radiation detector which comprises a reflecting material for reflecting high energy radiations behind the detection part thereof.

According to the fifth aspect of the present invention, there is provided a wide range radiation detector according to the first through the fourth aspects, wherein traveling directions of the radiations into the detection part are parallel to the longer sides of the semiconductor elements.

According to the sixth aspect of the present invention, there is provided a wide range radiation detector wherein the plurality of semiconductor elements thereof are wired to be parallel to each other so that output signals from respective elements are added.

According to the seventh aspect of the present invention, there is provided a wide range radiation detector which comprises a comparison part for calculating determination values corresponding to cesium-134 and cesium-137 on added output signals from the semiconductor elements thereof and comparing both of the calculated determination values.

According to the eighth aspect of the present invention, there is provided a wide range radiation detector which comprises a positron detecting part for extracting the signals of radiations having the energy of 511 keV out of added output signals from respective semiconductor elements thereof.

According to the ninth aspect of the present invention, there is provided a wide range radiation detector which comprises a determination part for calculating determination values corresponding to argon-41 on added output signals from respective semiconductor elements thereof.

According to the tenth aspect of the present invention, there is provided a wide range radiation detector in which the cathode electrode on the radiation incidence plane of each of the plurality of semiconductor elements thereof is a resistive electrode, and which radiation detector comprises: position detecting parts connected to the semiconductor elements respectively for detecting the incidence positions of the radiations in the resistive electrodes by comparing first output pulses generated by the radiations and detected at both the ends of the resistive electrodes and second output pulses generated by the radiations and detected at the anode electrodes of the semiconductor elements, and a radiation position detecting part for detecting the incidence positions of the radiations in the detection part of radiations thereof on signals of the position detecting parts.

According to the eleventh aspect of the present invention, there is provided a wide range radiation detector in which spaces between the plurality of layered semiconductor elements of the detection part thereof are filled with a gas having a small atomic number or a vacuum, and in which the detection part outputs the sums of charges generated in the respective semiconductor elements.

According to the twelfth aspect of the present invention, there is provided a wide range radiation detector which comprises a means for discriminating only pulses having short rise time among output pulses of the respective semiconductor elements thereof to take out them.

According to the thirteenth aspect of the present invention, there is provided a wide range radiation detector in which the thickness of each of the plurality of semiconductor elements thereof is about the mean drifting length of one of charge carriers which has a smaller mobility.

According to the fourteenth aspect of the present invention, there is provided a wide range radiation detector in which voltages having the same polarity are imposed on electrodes on adjacent surfaces of semiconductor elements adjacent to each other among the plurality of layered semiconductor elements thereof.

According to the fifteenth aspect of the present invention, there is provided a wide range radiation detector in which semiconductor elements adjacent each other among the plurality of semiconductor elements thereof adhere closely to each other with putting an electrode between each of them.

According to the sixteenth aspect of the present invention, there is provided a wide range radiation detector in which the shapes of the plurality of layered semiconductor elements thereof are coaxial cylinders.

BRIEF DESCRIPTION OF THE DRAWINGS

Further objects and advantages of the present invention can be more fully understood from the following detailed description taken in conjunction with the accompanying drawings, in which.

DETAILED DESCRIPTION OF THE PREFERRED EMBODIMENTS

Preferred embodiments of the present invention will now be described in detail with reference to the accompanying drawings.

EMBODIMENT 1

Figure 1:
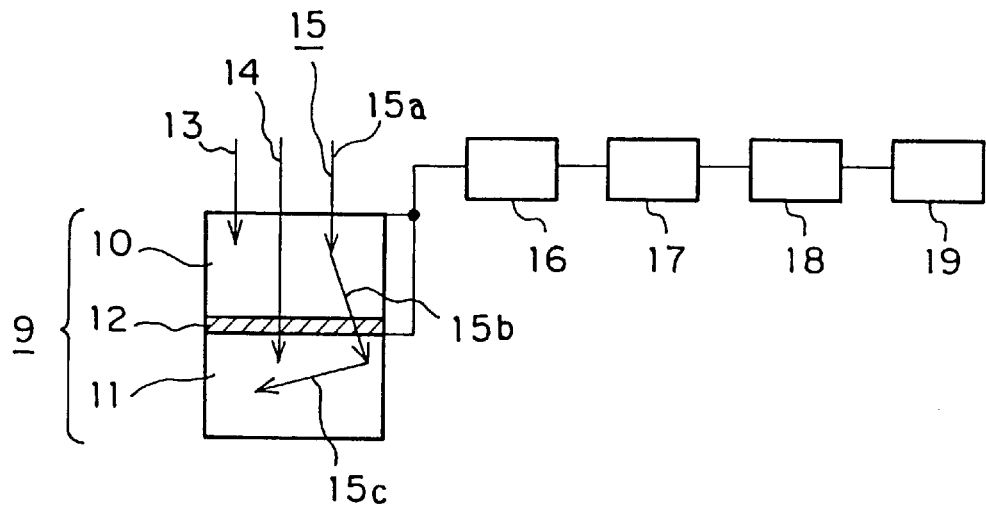
FIG. 1 is a block diagram showing the construction of the wide range radiation detector of a first embodiment (embodiment 1) of the present invention.

FIG. 1 is a block diagram showing the construction of the wide range radiation detector of the embodiment 1 of the present invention. In the figure, reference numeral 9 designates a detection part composed of a first and a second semiconductor elements 10 and 11 layered on each other with an insulating membrane 12 between each of them. Reference numerals 13, 14 and 15 designate radiations incident on any one of both the semiconductor elements 10 and 11. Reference numeral 16 designates a preamplifier taking out and amplifying each output pulse which is a sum of output pulses from both the semiconductor elements 10 and 11. Each output pulse coming into the preamplifier 16 has pulse height proportional to the energy of each radiation 13, 14 or 15 incident on the semiconductor elements 10 and 11 and absorbed there. Reference numeral 17 designates a main amplifier connected to the preamplifier 16. Reference numeral 18 designates an analog-digital converter connected to the main amplifier 17. Reference numeral 19 designates a multi-channel pulse-height analyzer connected to the analog-digital converter 18.

The insulating membrane 12 is made from a material having small atomic number and a small density, and formed to be thin so as not to influence incident radiations. Both the semiconductor elements 10 and 11 are fully insulated by such an insulating membrane 12.

Next, the operation of the wide range radiation detector of the embodiment 1 structured as above will be described. The description will be given as to gamma rays distributed in a wide energy range as the radiations, but the radiation detector can also be applied to high energy beta rays. At first, the radiations 13, 14 and 15 enter the detection part 9. The whole energy of the radiation 13 is absorbed in the first semiconductor element 10; the radiation 14 passes through the first semiconductor element 10 without any interaction; the radiation 15 causes, for example, Compton scattering in the first semiconductor element 10, and the energy of a radiation 15*a* is absorbed in the element 10, but the energy of radiations 15*b* and 15*c* is not absorbed in the element 10 but emitted to the outside thereof.

Next, the whole energy of the radiation 14 is absorbed in the second semiconductor element 11, and the whole energy of the radiations 15*b* and 15*c* having the residual energy of the radiation 15 is also absorbed in the second semiconductor element 11. Consequently, output pulses corresponding to the radiations 13, 14 and 15 are respectively detected by the preamplifier 16, which adds output pulses from both the semiconductor elements 10 and 11.

Then, after that, as in the conventional detector, these output pulses are amplified by the preamplifier 16 and the main amplifier 17, and converted from analog signals to digital signals by the analog-digital converter 18, and further counted by the multi-channel pulse-height analyzer 19 by every pulse height value. Thus, the energy distributions and the dose rates of the radiations incident on the detection part 9 are measured on the basis of the results of the analysis of the multi-channel pulse-height analyzer 19.

Since the detection part 9 of the wide range radiation detector of the embodiment 1 structured as above is composed of the first and the second semiconductor elements 10 and 11 layered on each other through the insulating membrane 12, the high energy region radiations 14 and 15, which cannot be detected by means of only one of the first and the second semiconductor elements 10 and 11, can be detected. Consequently, the radiation detector has improved sensitivity for the detection of wide energy range radiations.

Next, for illustrating the wide range radiation detector structured as above in comparison with a conventional detector, the description will be given with reference to FIG. 2 as well as FIG. 1. At first, the first and the second semiconductor elements 10 and 11 are supposed to be cubes 2 mm wide by 2 mm thick respectively and made from CdTe (Cadmiumtelluride). The relative sensitivity of the embodiment 1, in the case where the sensitivity of a radiation detector which uses only the semiconductor element 10 and can be regarded as the conventional detector is set to be 1 and when the energy of γ rays incident on the detection part of the embodiment 1 vary in sequence, was simulated by means of Monte Carlo calculation codes EGS-4 concerning the transportation of electrons and photons, and the results of the simulation calculation is shown in FIG. 2.

Figure 2:
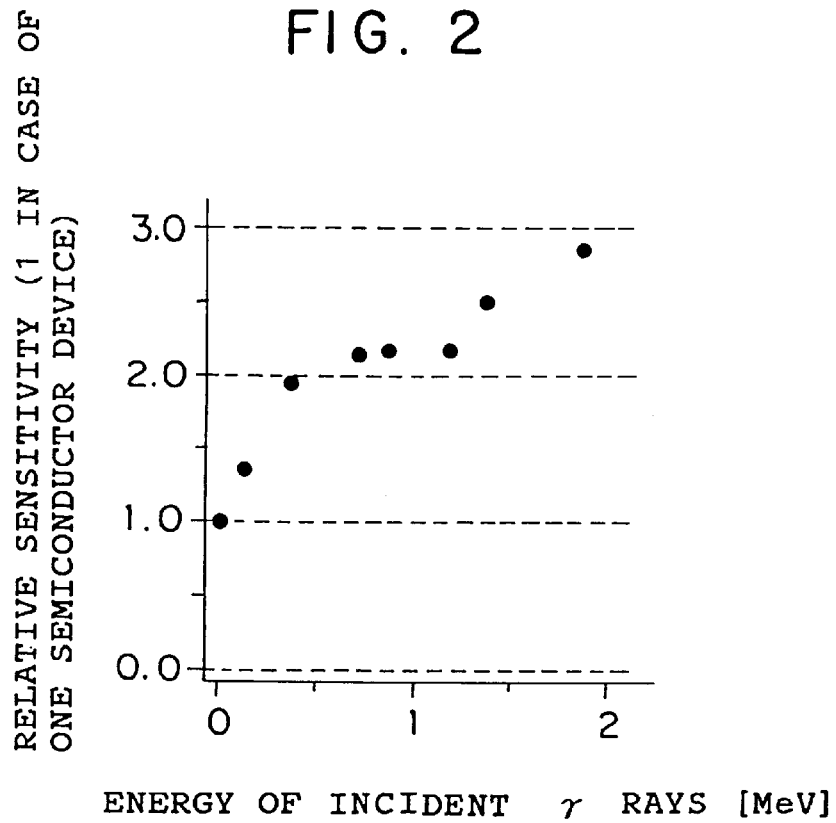
FIG. 2 is a graph showing the results of simulation calculations as to the relative sensitivity of the wide range radiation detector shown in FIG. 1 to a conventional wide range radiation detector.

As it is apparent from FIG. 2, the relative sensitivity exceeds two in energy regions larger than 0.5 MeV. Consequently, it is ascertained that the sensitivity is enhanced more than the degree of the increase of the volume of the detection part 9.

EMBODIMENT 2

Figure 3:
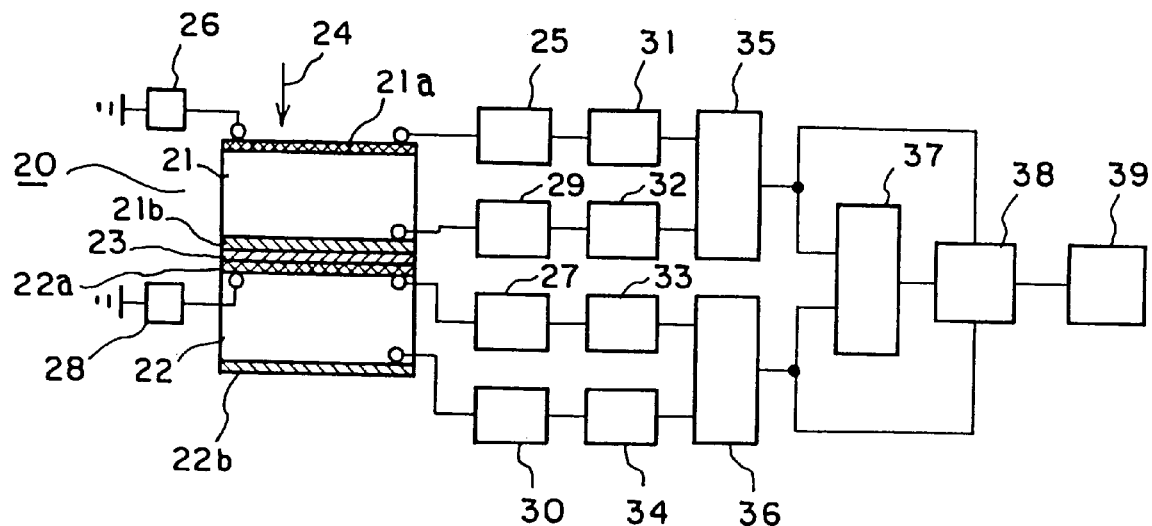
FIG. 3 is a block diagram showing the construction of the wide range radiation detector of a second embodiment (embodiment 2) of the present invention.

FIG. 3 is a block diagram showing the construction of the wide range radiation detector of the embodiment 2 of the present invention. In the figure, reference numeral 20 designates a detection part composed of a first and a second semiconductor elements 21 and 22 layered on each other through an insulating membrane 23. Reference numerals 21*a* and 22*a* designate the cathode electrodes of both the semiconductor elements 21 and 22; the cathode electrodes 21*a* and 22*a* are formed as resistive electrodes here. Reference numeral 21*b* and 22*b* designate anode electrodes of both the semiconductor elements 21 and 22. Reference numeral 24 designates a radiation incident on the detection part 20. Reference numerals 25 and 26 designate preamplifiers connected to respective ends of the resistive electrode 21*a*; the preamplifier 26, which is connected to one side end of the electrode 21*a*, are grounded. Reference numerals 27 and 28 designate preamplifiers connected to respective ends of the resistive electrode 22*a*; the preamplifier 28, which is connected to one side end of the electrode 22*a*, is grounded. Reference numerals 29 and 30 designate preamplifiers detecting the output pulses (hereinafter referred to as second output pulses) outputted from the anode electrodes 21*b* and 22*b* and amplifying them.

Reference numerals 31, 32, 33 and 34 designate main amplifier connected to the preamplifiers 25, 29, 27 and 30 respectively. Reference numeral 35 designates dividing circuit as position detecting part connected to the main amplifiers 31 and 32 and comparing first and second output pulses from the main amplifiers 31 and 32. Reference numeral 36 designates dividing circuit as position detecting part connected to the main amplifiers 33 and 34 and comparing first and second output pulses from the main amplifiers 33 and 34. Reference numeral 37 designates a logical sum circuit which receive the outputs from the dividing circuits 35 and 36. Reference numeral 38 designates an analog-digital converter connected to the dividing circuits 35 and 36 as a radiation position detecting sections and the logical sum circuit 37 as the control signal outputting section. Reference numeral 39 designates a multi-channel pulse-height analyzer connected to the analog-digital converter 38.

Next, the operation of the wide range radiation detector of the embodiment 2 structured as above will be described. When the radiation 24 enters the first semiconductor element 21 of the detection part 20 at first, output pulses are generated in the resistive electrode 21*a* to the both the grounded preamplifier 26 on the one side end of the electrode 21*a* and the preamplifier 25 on the other side end of the electrode 21*a*. The preamplifier 25 detects a charge value proportional to the distance from an end of the resistive electrode 21*a* (the position where the preamplifier 26 is connected) to the incidence position of the radiation 24 in the resistive electrode 21*a* as a first output pulse. On the other hand, the preamplifier 29 detects the whole charge values of the radiation 24 as a second output pulse.

Next, the main amplifiers 31 and 32 amplify the first and the second output pulses, and the dividing circuit 35 divides the value of the first output pulse by the value of the second output pulse to detect the incidence position of the radiation 24 as a pulse height. The same operations described above is performed on the side of the second semiconductor element 22. Then, the logical sum circuit 37 logically adds outputs of the dividing circuits 35 and 36. The incidence position of the radiation 24 into the detection part 20 will be detected by either output of the dividing circuits 35 or 36 using output from the logical sum circuit 37 as a control signal. The added signal as the information of the incidence position of radiation 24 is then converted from an analog signal to a digital signal by the analog-digital converter 38, and the multi-channel pulse-height analyzer counts the digital signal by every pulse height value.

The wide range radiation detector of the embodiment 2 structured as above can detect high energy region radiations similarly to the embodiment 1, and since the embodiment 2 is structured so as to detect the incidence positions of radiations into the detection part 20 also, the sensitivity for detecting the incidence positions of wide energy range radiations can be improved. It need scarcely be said that another circuit for taking out the sums of the output pulses from the anode electrodes 21b and 22b may be formed similarly to the embodiment 1 for enabling the detection of the energy distributions and the dose rates of radiations like the embodiment 1 at the same time.

EMBODIMENT 3

Figure 4:
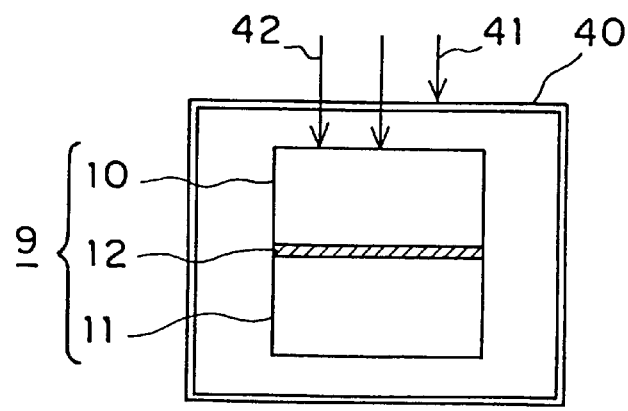
FIG. 4 is a schematic view showing the construction of the detection part of the wide range radiation detector of a third embodiment (embodiment 3) of the present invention.

FIG. 4 is a schematic view showing the construction of the detection part of the wide range radiation detector of the embodiment 3 of the present invention. In the figure, the same parts as those of the embodiment 1 are designated by the same reference characters as those of the embodiment 1, and the description of them will be omitted. Reference numeral 40 designates an absorption material for absorbing low energy radiations made from, for example, aluminum and formed so as to enclose the detection part 9. Reference numerals 41 and 42 designate radiations. The wide range radiation detector of the embodiment 3 constructed as above absorbs low energy radiation 41 with the absorption material 40 and allows, for example, the high energy region radiation 42 and so forth other than the low energy radiation to enter the detection part 9. Consequently, the choke phenomena of the detection part 9 caused by the excess of the dose rates of the low energy on radiation 41 and so forth can be reduced. Thus, it becomes more certain to detect high energy region radiations 42.

EMBODIMENT 4

Figure 5:
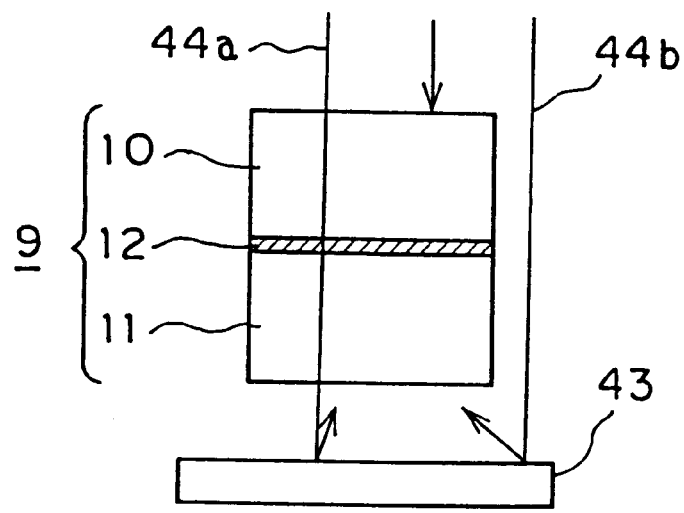
FIG. 5 is a schematic view showing the construction of the detection part of the wide range radiation detector of a fourth embodiment (embodiment 4) of the present invention.

FIG. 5 is a schematic view showing the construction of the detection part of the wide range radiation detector of the embodiment 4 of the present invention. In the figure, the same parts as those of each embodiment described above are designated by the same reference characters as those of each of the embodiments, and the description of them will be omitted. In the figure, reference numeral 43 designates a reflecting material reflecting high energy radiations by back scattering and made from, for example, lead; the reflecting material is formed behind the detection part 9. Reference numeral 44 designates radiations.

The wide range radiation detector of the embodiment 4 constructed as above reflects and back scatters a high energy region radiation 44b traveling off the incident paths to the detection part 9 in the vicinity of the part 9 and a high energy region radiation 44a penetrating the detection part 9 without interacting in the part 9 for making them enter the part 9. Consequently, the incident region (area) of detectable radiations is enlarged more than the region of the detection part 9 itself. Thus, it becomes more certain to detect high energy region radiations 44.

EMBODIMENT 5

Figure 6:
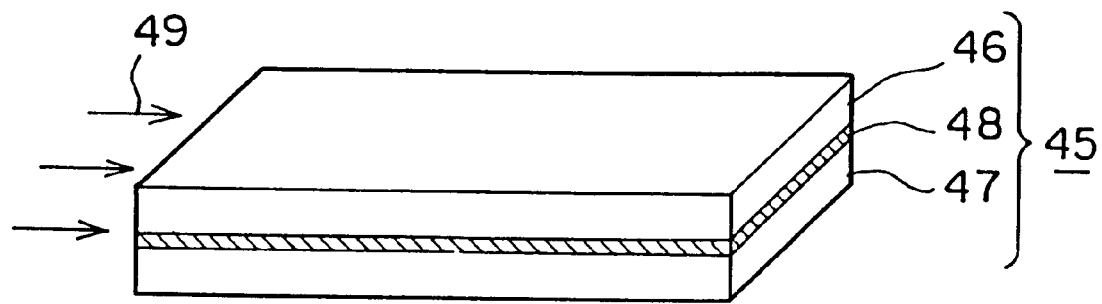
FIG. 6 is a perspective view showing the construction of the detection part of the wide range radiation detector of a fifth embodiment (embodiment 5) of the present invention.

FIG. 6 is a perspective view showing the construction of the detection part of the wide range radiation detector of the embodiment 5 of the present invention. In the figure, reference numeral 45 designates the detection part composed of a first and a second semiconductor elements 46 and 47 layered on each other through an insulating membrane 48; the areas of both the semiconductor elements 46 and 47 are enlarged as much as possible within a range capable of manufacturing. Reference numeral 49 designates radiations.

In the wide range radiation detector of the embodiment 5 constructed as above, the incident directions of the radiations 49 into the detection part 45 is parallel to the longer sides of both the semiconductor elements 46 and 47, and the paths of the radiations 49 in both the semiconductor elements 46 and 47 are made longer. Consequently, the detection efficiency of the high energy region radiations 49 is enhanced by means of the same two of the semiconductor elements 46 and 47. Thus, the detection of high energy region radiations 49 becomes still easier.

EMBODIMENT 6

Figure 7:
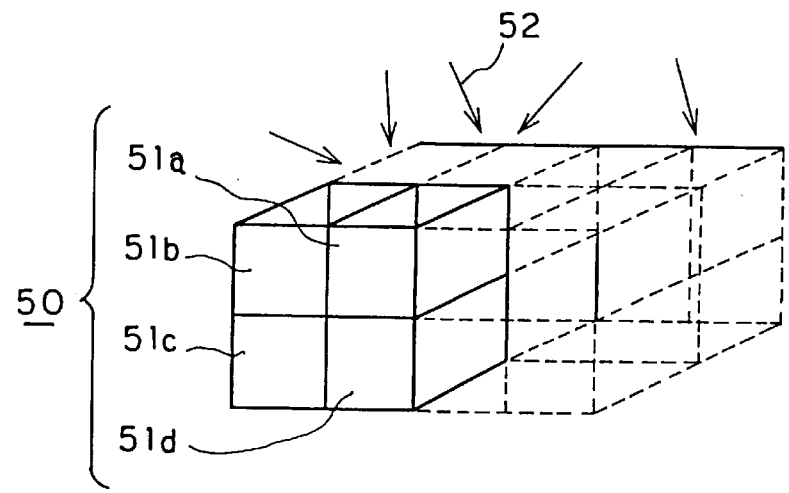
FIG. 7 is a perspective view showing the construction of the detection part of the wide range radiation detector of a sixth embodiment (embodiment 6) of the present invention.

FIG. 7 is a perspective view showing the construction of the detection part of the wide range radiation detector of the embodiment 6 of the present invention. In the figure, reference numeral 50 designates the detection part composed of the semiconductor elements 51a, 51b, 51c, 51d, . . . layered three-dimensionally on each other through insulating membranes (not shown). Reference numeral 52 designates radiations. In the wide range radiation detector of the embodiment 6 constructed as above, the volume of the detection part 50 is enlarged more than those of the above embodiments, and consequently, the paths of high energy region radiations in the detection part 50 become longer even if the incidence directions of them are not specified (for example, in case of the use of an area monitor). Then the detection efficiency of the high energy region radiations can be enhanced. Consequently the detection of the high energy region radiations 52 becomes still easier.

EMBODIMENT 7

Figure 8:
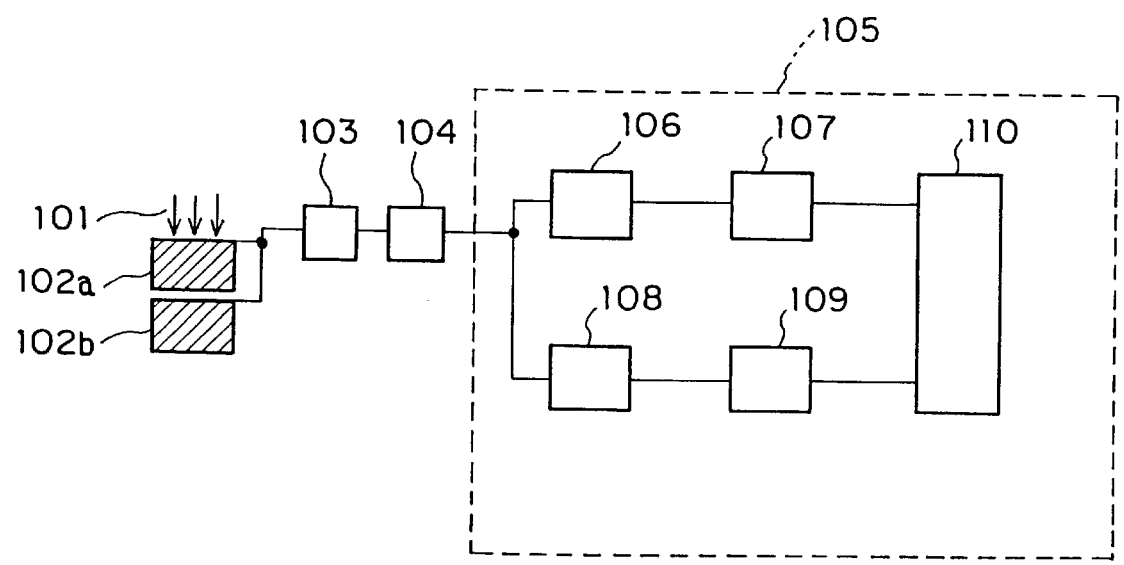
FIG. 8 is a block diagram showing the construction of the wide range radiation detector of a seventh embodiment (embodiment 7) of the present invention.

FIG. 8 is a block diagram showing the construction of the wide range radiation detector of the embodiment 7 of the present invention. In the figure, reference numeral 101 designates radiations. Reference numerals 102a and 102b designate semiconductor elements disposed so as to be layered on each other in the traveling direction of the radiations 101; the output terminals of the semiconductor elements 102a and 102b are wired in parallel. Reference numeral 103 designates a preamplifier amplifying the voltages of the output signals from the semiconductor elements 102a and 102b. Reference numeral 104 designates a main amplifier amplifying the electric power of output signals from the preamplifier 103. Reference numeral 105 designates a comparison part calculating determination values corresponding to cesium-134 (secondarily produced from fission products) and cesium-137 (produced by the fission of uranium) on output signals from the main amplifier 104 respectively, and comparing both the calculated determination values. Reference numeral 106 designates a pulse-height analyzer whose discrimination level is set in proportion to the sensitivity of the semiconductor elements 102a and 102b to cesium-134, and the gains of the preamplifier 103 and the main amplifier 104. Reference numeral 107 designates a counting rate meter counting and outputting the numbers of pulses per unit hour outputted from the pulse-height analyzer 106 and corresponding to cesium-134. Reference numeral 108 designates a pulse-height analyzer whose discrimination level is set in proportion to the sensitivity of the semiconductor elements 102a and 102b to cesium-137, and the gains of the preamplifier 103 and the main amplifier 104. Reference numeral 109 designates a counting rate meter counting and outputting the numbers of pulses per unit hour outputted from the pulse-height analyzer 108 and corresponding to cesium-137. Reference numeral 110 designates an operation part performing the comparison operation of the dose values of cesium-134 and cesium-137 on the output signals of the counting rate meters 107 and 109, and outputting the operated values. The comparison part 105 is composed of the pulse-height analyzers 106 and 108, the counting rate meters 107 and 109, and the operation part 110.

Figure 9:
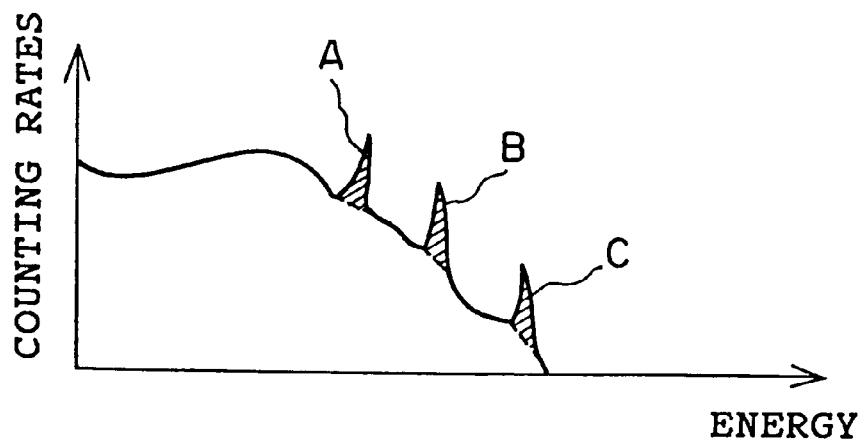
FIG. 9 is a graph showing the counting rates of radiations including γ rays generated by cesium-134 and cesium-137.

Next, the operation thereof will be described. As shown in the graph of counting rates of FIG. 9, cesium-134 radiates γ rays that are mainly shown as the peak A of the energy of 605 keV and the peak C of 796 keV. Cesium-137 radiates a γ ray that is shown as the peak B of the energy of 662 keV. In the embodiment 7, the semiconductor elements 102a and 102b detect radiations 101 to convert them to electric signals, and after that, the preamplifier 103 and the main amplifier 104 amplify the electric signals to input into the comparison part 105. In the comparison part 105, the pulse-height analyzers 106 and 108 analyze the pulse height values of cesium-134 and cesium-137, and then the counting rate meters 107 and 109 obtain the determination values of amounts of cesium-134 and cesium-137 respectively, and further the operation part 110 compares both the determination values. Consequently, for example, in case of measuring spent nuclear fuel, the burn-up of the spent nuclear fuel can be obtained highly sensitively on signals from the comparison part 105. Therefore, the burn-up of spent nuclear fuel can be detected non-destructively, which makes it possible to realize the reduction of costs.

EMBODIMENT 8

Figure 10:
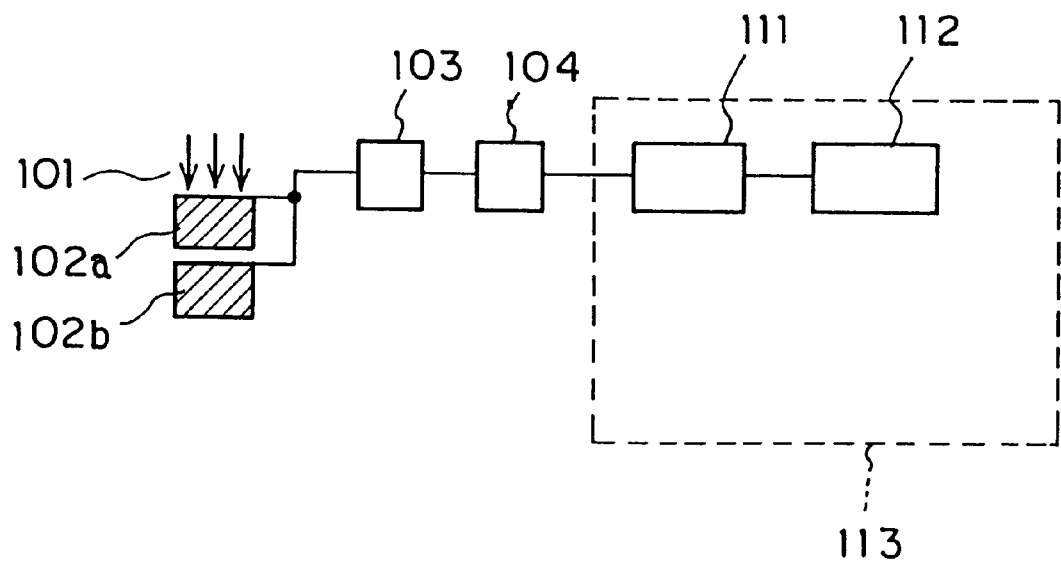
FIG. 10 is a block diagram showing the construction of the wide range radiation detector of an eighth embodiment (embodiment 8) of the present invention.

FIG. 10 is a block diagram showing the construction of the wide range radiation detector of the embodiment 8 of the present invention. In the figure, reference numeral 101 designates radiations. Reference numerals 102a and 102b designate semiconductor elements disposed so as to be layered on each other in the traveling direction of the radiations 101; the output terminals of the semiconductor elements 102a and 102b are wired in parallel. Reference numeral 103 designates a preamplifier amplifying the voltages of output signals from the semiconductor elements 102a and 102b. Reference numeral 104 designates a main amplifier amplifying the electric power of output signals from the preamplifier 103. Reference numeral 111 designates a pulse-height analyzer whose discrimination level is set in proportion to the sensitivity of the semiconductor elements 102a and 102b to argon-41 (produced by the irradiation of neutrons to argon-40), and the gains of the preamplifier 103 and the main amplifier 104. Reference numeral 112 designates a counting rate meter counting and outputting the numbers of pulses per unit hour outputted from the pulse-height analyzer 111 and corresponding to argon-41. Reference numeral 113 designates a determination part calculating determination values corresponding to argon-41 on output signals from the main amplifier 104; the determination part 113 is composed of the pulse-height analyzer 111 and the counting rate meter 112.

Next, the operation thereof will be described. Argon-41 radiates γ rays having the energy of 1.29 MeV. In the embodiment 8, similarly in the embodiment 7, the semiconductor elements 102a and 102b detect radiations 101 to convert them to electric signals, and after that, the preamplifier 103 and the main amplifier 104 amplify the electric signals to input into the determination part 113. In the determination part 113, the pulse-height analyzer 111 analyzes the pulse height values of argon-41, and then the counting rate meter 112 obtains the determination values of an amount of argon 41. Consequently, for example, if the measurement of argon 41 is performed in the air in the inside of a building in an atomic plant, the ratios of argon-41 to argon 40 in the air, namely the activation degrees of argon, can be detected on signals from the determination part 113 highly sensitively. Therefore, the wide range radiation detectors of the embodiment can be utilized for the safety management of workers in atomic power plants.

EMBODIMENT 9

The embodiment 9 of the present invention is to be applied for an object to measure positrons indirectly, which are irradiated to a sample (any material may be used provided that it has an electron), by detecting radiations having the energy of 511 keV radiated from the sample.

Figure 11:
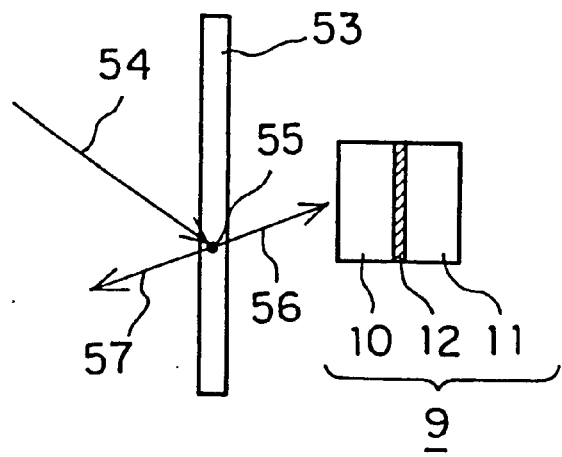
FIG. 11 is an explanatory diagram for illustrating the principle of the wide range radiation detector of a ninth embodiment (embodiment 9) of the present invention.

FIG. 11 is an explanatory diagram for illustrating the principle of the wide range radiation detector of the embodiment 9. In the figure, the same parts as those of each embodiment described above are designated by the same reference characters as those of each of the embodiments, and the description of them will be omitted. Reference numeral 53 designates a sample. Reference numeral 54 designates a positron irradiated to the sample 53. Reference numeral 55 designates an electron coupled with the positron 54 in the sample 53. Reference numerals 56 and 57 designate radiations having the energy of 511 keV and radiated in directions just opposite to each other from the sample 53 by the coupling of the positron 54 and the electron 55.

Figure 12:
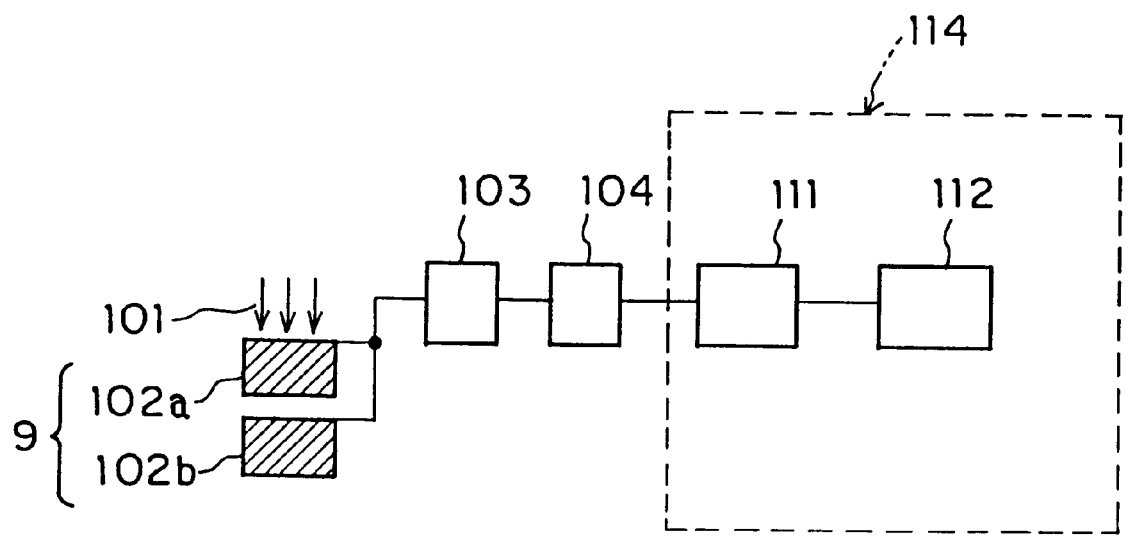
FIG. 12 is a block diagram showing the construction of the wide range radiation detector of the embodiment 9.

FIG. 12 is a block diagram showing the construction of the wide range radiation detector of the embodiment 9. Similarly in FIG. 11, the same parts as those of each embodiment described above are designated by the same reference characters as those of each of the embodiments, and the description of them will be omitted. In the embodiment, the discrimination level of the pulse-height analyzer 111 is set at the energy of 511 keV of a radiation that is radiated due to the coupling of a positron and an electron. The pulse-height analyzer 111 and the counting rate meter 112 compose positron detecting part 114.

Next, the operation thereof will be described. In the wide range radiation detector of the embodiment 9, similarly in each of the embodiments described above, the positron detecting part 114 extracts the signals of the radiations of the energy of 511 keV on the results of the detection in the detection part 9. Then, as described with reference to FIG. 11, the positron detecting part 114 detects only the radiation 56 having the energy of 511 keV produced by the coupling of the positron 54 and the electron 55. Consequently, positrons can be detected highly sensitively.

EMBODIMENT 10

The embodiment 10 of the present invention is to be applied for an object to measure the momentums of electrons indirectly by irradiating positrons to a sample (any material may be used provided that it has an electron) in conformity with the law of the conservation of the momentums of electrons and positrons in the sample.

Figure 13:
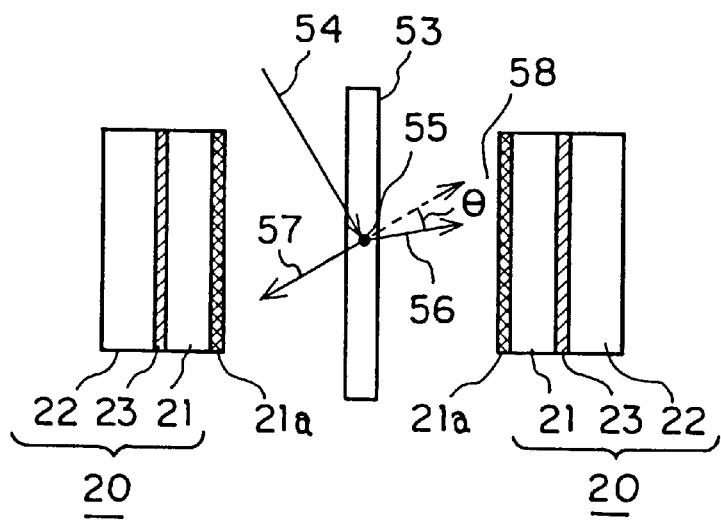
FIG. 13 is an explanatory diagram for illustrating the principle of the wide range radiation detector of a tenth embodiment (embodiment 10) of the present invention.

FIG. 13 is an explanatory diagram for illustrating the principle of the wide range radiation detector of the embodiment 10. In the figure, the same parts as those of each embodiment described above are designated by the same reference characters as those of each of the embodiments, and the description of them will be omitted. Reference numeral 58 designates an angle shifted from 180 degrees formed by the radiation 57 and the radiation 56; the shifted angle 58 is caused by the conservation of the momentums of the positron 54 and the electron 55 still after the coupling of them.

If the wide range radiation detector of the embodiment 10 is structured to take out only the signals of the radiations 56 and 57 having the energy of 511 keV like in the embodiment 9 to detect both of the incidence positions of the radiations 56 and 57 similarly in the embodiment 2 for obtaining the angle 58 on both the positions, the sum of the momentums of the positron 54 and the electron 55 can be obtained highly sensitively.

Besides, if the momentum of an electron at a position where a positron is irradiated is obtained by irradiating the positron, whose momentum is known, to a sample such as metal and by using the detector of the embodiment 10, the distributions of the momentums of the electrons of the metal can be measured highly sensitively.

EMBODIMENT 11

Figure 14:
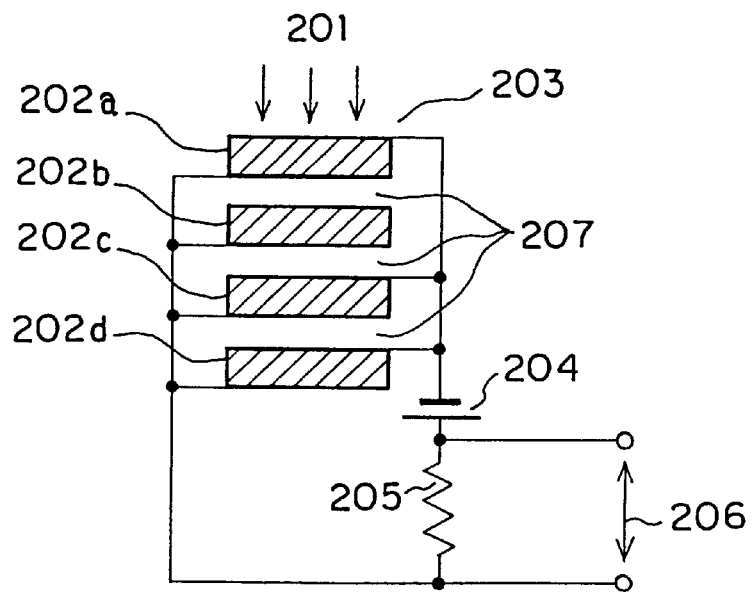
FIG. 14 is a schematic view showing the construction of the wide range radiation detector of an eleventh embodiment (embodiment 11) of the present invention.

FIG. 14 is a schematic view showing the construction of the wide range radiation detector of the embodiment 11 of the present invention. In the figure, reference numeral 201 designates radiations to be measured. Reference numerals 202a, 202b, 202c and 202d designate semiconductor elements, which touch conductive electrodes 203 and are wired in parallel. A voltage is imposed on each semiconductor element by a power supply 204, and the changes of the voltages generated at both ends of a resistor 205 are taken out as output signals 206. The output signals 206 are inputted to a preamplifier and a main amplifier similarly in the conventional radiation detector. Respective spaces between semiconductor elements are insulated by air 207. Since the air 207 has a small atomic number and a low density, and further is formed to be thin, it causes no influence on incident radiations. Moreover, since the voltage imposed on each semiconductor element is not so high, the air 207 can insulate each semiconductor element sufficiently. The material inserted into the space between semiconductor elements may be another gas having a small atomic number or a vacuum, provided that it scarcely interacts with radiations and is an insulator.

Next, the operation of the wide range radiation detector of the embodiment 11 constructed as above will be described. At first, the radiations 201 enter the semiconductor elements 202a, 202b, 202c and 202d. One of them gives the whole energy thereof only to the first semiconductor element 202a; another one passes through the element 202a without no interaction with it and gives the whole energy thereof only to the element 202b. Further radiation causes, for example, Compton scattering in the first element 202a to give a part of the energy thereof to the element 202a, and a radiation having the residual energy of the scattered radiation gives the whole energy thereof to the second element 202b. Furthermore, similar phenomena can be occurred in the elements such as 202c and 202d other than the elements 202a and 202b.

As a result, charges such as electrons and holes are generated in the semiconductor elements 202a, 202b, 202c and 202d owing to the energy given to them, and the charges move in conformity with an electric field formed in the inside of the elements by the voltage generated by the power supply 204. The movements of the charges vary electrostatic energy stored in the elements to induce charges on the electrodes 203 attached to the elements. The induced charges vary the voltage 206 to make output signals. Since the largeness of the output signals, namely the pulse heights thereof, is proportional to the amount of the charges induced on the electrodes 203, the sum totals of the energy given to the elements 202a, 202b, 202c and 202d by the radiations 201 are consequently proportional to the pulse heights of the output pulses.

Since the wide range radiation detector of the embodiment 11 constructed as above includes the elements 202a, 202b, 202c and 202d layered on each other through the air 207 or the like, it can detect high energy radiations that cannot be detected by detectors having only one semiconductor element. Consequently, the detection sensitivity thereof to wide energy range radiations can be improved.

EMBODIMENT 12

Figure 15:
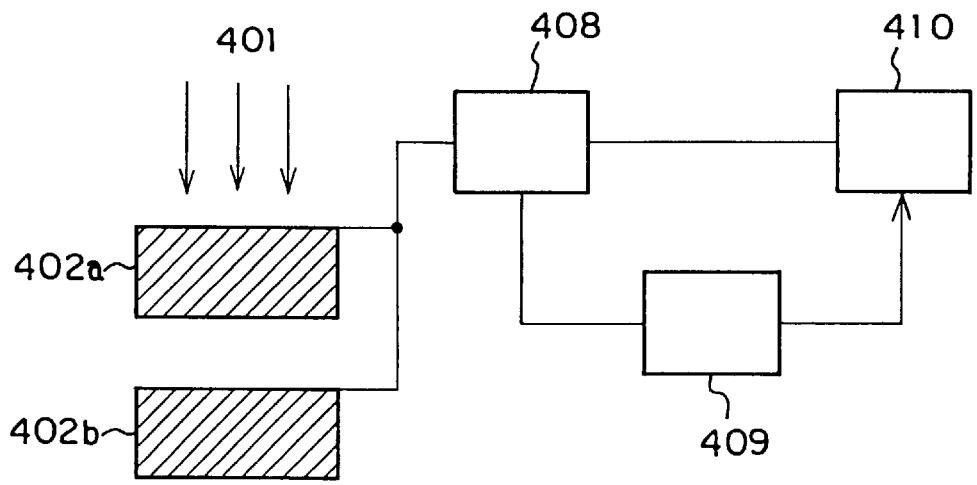
FIG. 15 is a block diagram showing the construction of the wide range radiation detector of a twelfth embodiment (embodiment 12) of the present invention.

FIG. 15 is a block diagram showing the construction of the wide range radiation detector of the embodiment 12 of the present invention. In the figure, reference numeral 401 designates radiations to be measured. Reference numerals 402a and 402b designate semiconductor elements. Reference numeral 408 designates an amplifier amplifying output signals from the elements 402a and 402b. Reference numeral 409 designates a pulse shape analyzer for analyzing the pulse shape of output pulses. Reference numeral 410 designates a multi-channel pulse-height analyzer counting the output pulses by every pulse height value.

The operation of the wide range radiation detector of the embodiment 12 structured as above will be described. At first, the radiations 401 enter the semiconductor elements 402a and 402b to give the energy of them to the elements. Similarly in the embodiment 11, pulses having pulse heights proportional to the sum totals of the energy given to the elements 402a and 402b by the radiations 401 are outputted to be amplified by the amplifier 408.

Figure 16:
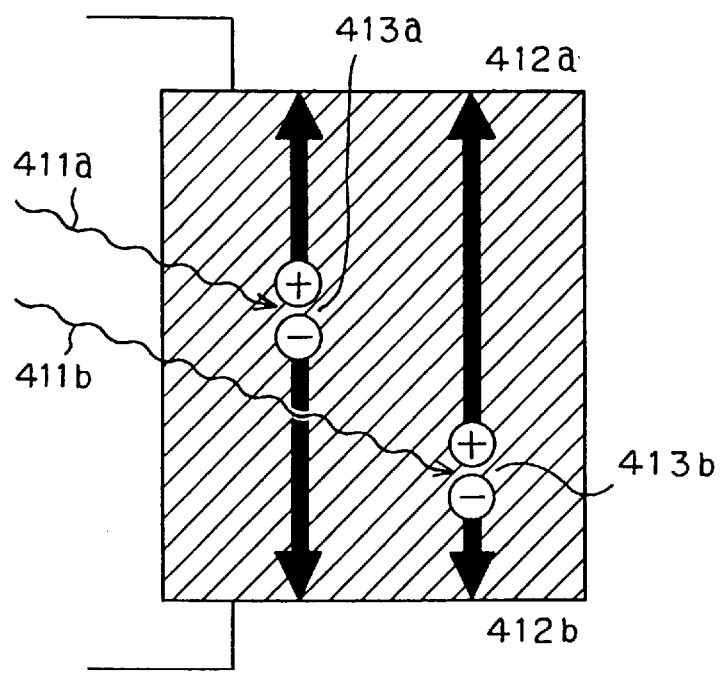
FIG. 16 is an explanatory diagram for illustrating the difference of the rise time of output pulses of the wide range radiation detector of the embodiment 12.

The rise time of the pulses amplified by the amplifier 408 depends on the positions of the interactions of radiations in the semiconductor elements. The fact will be described with reference to the explanatory diagram of FIG. 16. If a radiation enters a semiconductor element to give the energy thereof to the element at a position in the element, charge carriers such as an electron and a hole are produced owing to the action of ionization thereof. The drifting speed of an electron is different from that of a hole by about one figure in some semiconductor elements. If, in a semiconductor element where the drifting speed of an electron is much faster than that of a hole, a radiation like the radiation 411a interacts with the element at a position 413a near to the minus electrode 412a of the electrodes attached to the element, the drifting length of an electron is long, and consequently, the collection time of charges is short and the rise time of a pulse is also short. On the contrary, if a radiation like the radiation 411b interacts with the element at a position 413b near to the plus electrode 412b of the electrodes, the drifting length of a hole is long, and consequently, the collection time of charges is long and the rise time of a pulse is also long. Now, in some semiconductor elements, the mobility of a hole between charge carriers is small and the mean drifting length of the hole is shorter than the thickness of the element. In such a semiconductor element, if a radiation interacts with the element at a position far from the minus electrode 412a, a hole cannot reach the minus electrode 412a because it is caught by a lattice defect and so forth, and the collection of charges becomes insufficient. On the contrary, if a radiation interacts with the element at a position near to the minus electrode 412a of the electrodes, a hole can easily reach the minus electrode 412a, and the collection of charges becomes sufficient.

As described above, in a semiconductor element in which the mobility of a hole is small, since a pulse having long rise time causes the insufficient collection of charges, a pulse height proportional to the whole energy given to the element by a radiation cannot be obtained. Accordingly, the radiation detector shown in FIG. 15 selects only pulses having short rise time to make gate signals for passing only the pulses having short rise time by means of the pulse shape analyzer 409. Then, the multi-channel pulse-height analyzer 410 will count only the pulses having short rise time by every pulse height value.

In the wide range radiation detector of the embodiment 12 structured as above, the detection part thereof is enlarged by the stack of the semiconductor elements 402a and 402b, and only the signals enabling the sufficient collection of charges are taken out. Consequently, the sensitivity of the detection of wide energy range radiations is enhanced, and the energy resolution thereof is also enhanced.

EMBODIMENT 13

Figure 17:
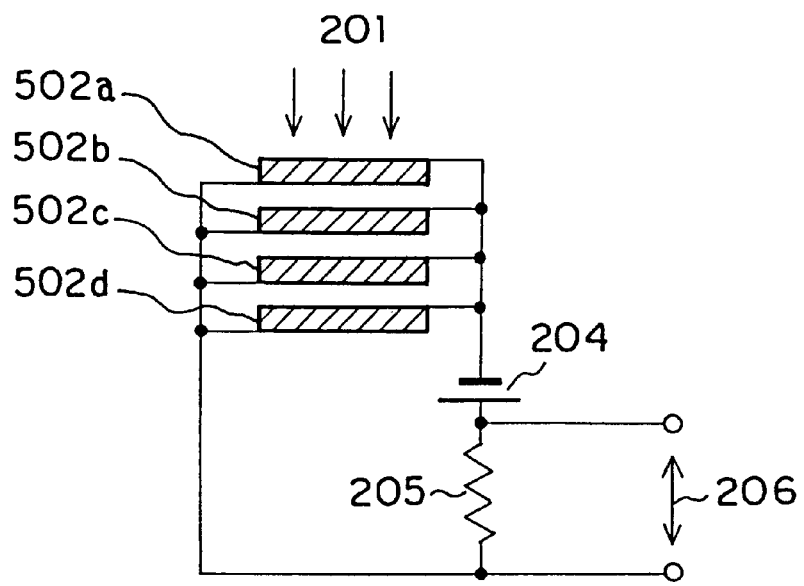
FIG. 17 is a schematic view showing the construction of the wide range radiation detector of a thirteenth embodiment (embodiment 13) of the present invention.

FIG. 17 is a schematic view showing the construction of the wide range radiation detector of the embodiment 13 of the present invention. In the figure, the same parts as those of the embodiment 11 described above are designated by the same reference characters as those of the embodiment, and the description of them will be omitted. Reference numerals 502a, 502b, 502c and 502d designate semiconductor elements having the thicknesses of about the mean drifting length of a charge carrier having the smaller mobility between charge carriers.

Since the wide range radiation detector of the embodiment 13 constructed as above is provided with the semiconductor elements 502a, 502b, 502c and 502d having the thicknesses of about the mean drifting length of a charge carrier, the probability of the arrival of the charge carriers to a collection electrode is greatly increased, which results the enhancement of the efficiency of the collection of charges. Moreover, the detection part thereof is enlarged because the elements are layered on each other. Furthermore, since the efficiency of the collection of charges is increased, the detection sensitivity of wide energy range radiations can further be enhanced, and the energy resolution thereof is also enhanced. If the enhancement of the energy resolution is regarded as important, the thicknesses of semiconductor elements may be made to be thinner than the mean drifting length (for example a half of it).

EMBODIMENT 14

Figure 18:
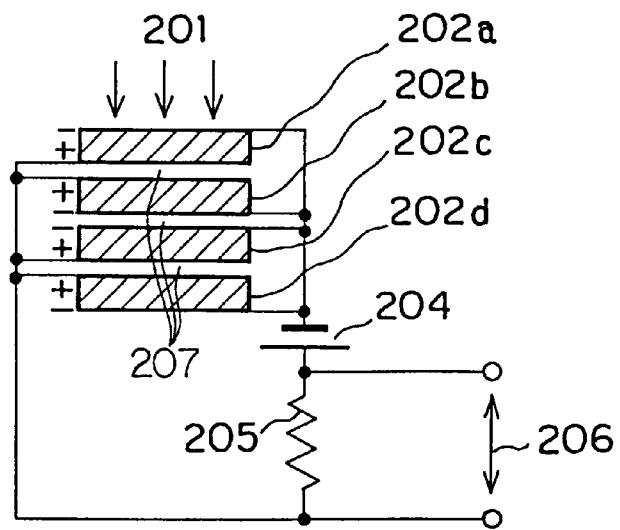
FIG. 18 is a schematic view showing the construction of the wide range radiation detector of a fourteenth embodiment (embodiment 14) of the present invention.

FIG. 18 is a schematic view showing the construction of the wide range radiation detector of the embodiment 14 of the present invention. In the figure, the same parts as those of the embodiment 11 are designated by the same reference characters as those of the embodiment, and the description of them will be omitted. A distinction from the embodiment 11 is that semiconductor elements layered on each other are wired so that the polarities of electric fields imposed on the elements are alternately changed between positive and negative polarities. Since the wide range radiation detector of the embodiment 14 constructed as above wires layered semiconductor elements so that the polarities of the electric fields imposed on them are changed alternately between positive and negative polarities, no electric fields are formed between the elements and the total electric capacitance of the elements becomes small. Since output pulses result from charges induced on electrodes attached to the semiconductor elements, it makes signal voltages generated by a fixed induced charges larger that the static capacitance of the detection part of a radiation detector becomes small. Consequently, the energy resolution of the detector is enhanced. Besides, since electric fields between elements are removed, insulation between the elements becomes easy, and spaces between the elements can be still smaller. Consequently, non-sensitive regions are further decreased, and the detection sensitivity of the detector to wide energy range radiations can further be enhanced.

EMBODIMENT 15

Figure 19:
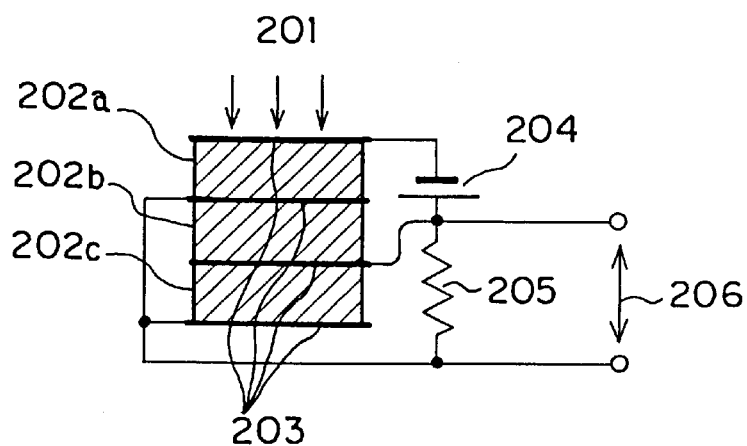
FIG. 19 is a schematic view showing the construction of the wide range radiation detector of a fifteenth embodiment (embodiment 15) of the present invention.

FIG. 19 is a schematic view showing the construction of the wide range radiation detector of the embodiment 15 of the present invention. In the figure, the same parts as those of the embodiment 11 are designated by the same reference characters as those of the embodiment, and the description of them will be omitted. A distinction from the embodiment 11 is that conductive electrodes 203 are put between semiconductor elements layered on each other and the electrodes 203 are respectively wired so that the electric potential imposed on the electrodes is alternately changed between positive and negative voltages. Since the wide range radiation detector of the embodiment 15 constructed as above has no spaces between elements and uses two electrodes of adjacent elements as one electrode, no non-sensitive regions between elements exist completely. Consequently, the sensitivity to wide energy range radiations is further enhanced. Beside, although single semiconductor element is thin to be fragile, semiconductor elements layered on each other through a plurality of electrodes have enlarged mechanical strength to be not fragile in the aggregate.

EMBODIMENT 16

Figure 20:
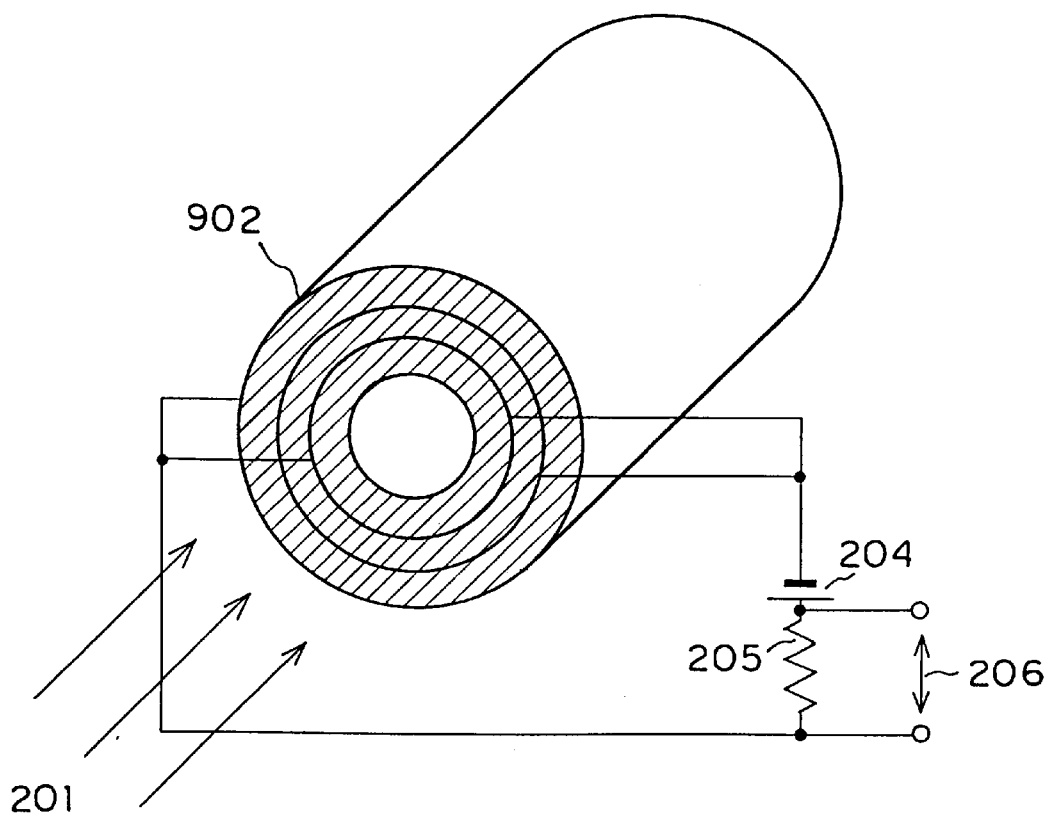
FIG. 20 is a schematic view showing the construction of the wide range radiation detector of a sixteenth embodiment (embodiment 16) of the present invention.
Figure 21:
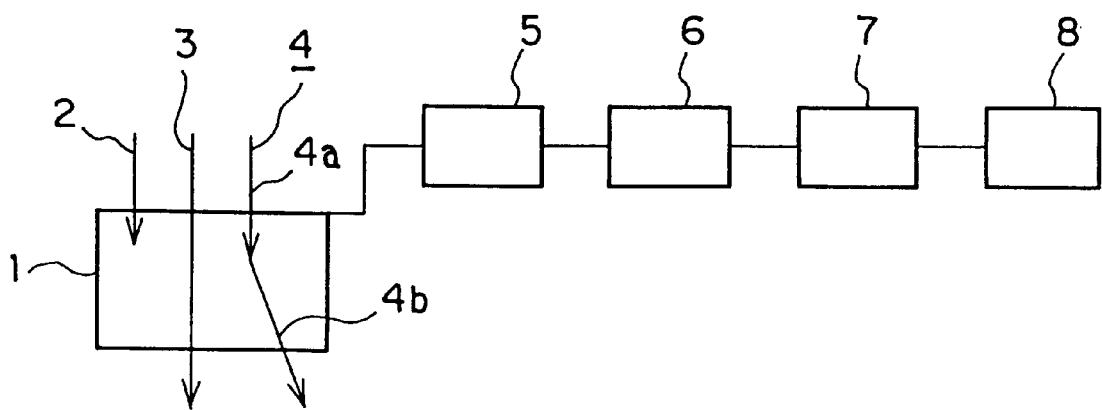
FIG. 21 is a block diagram showing the construction of conventional wide range radiation detector.

FIG. 20 is a schematic view showing the construction of the wide range radiation detector of the embodiment 16 of the present invention. In the figure, the same parts as those of the embodiment 11 are designated by the same reference characters as those of the embodiment, and the description of them will be omitted. Reference numeral 902 designates semiconductor elements shaped into coaxial cylinders and having the thicknesses of about the mean drifting length of a charge carrier having smaller mobility between charge carriers; the semiconductor elements are layered on each other through cylindrical electrodes. Since the wide range radiation detector of the embodiment 16 constructed as above receives incident radiations along the direction of the longer sides of the coaxial cylindrical semiconductor elements, the incident paths of the radiations are long and secondary radiations generated by such as Compton scattering are easily detected. Consequently, the detection efficiency of high energy region radiations is increased and the sensitivity to them is improved.

It will be appreciated from the foregoing description that, according to the first aspect of the present invention, since the detection part thereof is composed of a plurality of layered semiconductor elements, there can be provided a wide range radiation detector which can detect high energy region radiations, and whose sensitivity is improved.

Furthermore, according to the second aspect of the present invention, since the detection part thereof is composed of a plurality of semiconductor elements layered on each other through an insulating membrane, there can be provided a wide range radiation detector which can detect high energy region radiations, and whose sensitivity is improved.

Furthermore, according to the third aspect of the present invention, since an absorption material for absorbing low energy radiations is provided in a traveling path of radiations into the detection part thereof, the choke phenomena of the detection part caused by low energy region radiations are reduced. Consequently, there can be provided a wide range radiation detector whose sensitivity for detecting high energy region radiations is further enhanced.

Furthermore, according to the fourth aspect of the present invention, since there is provided a reflecting material for reflecting high energy radiations behind the detection part thereof, more high energy region radiations enter the detection part. Consequently, there can be provided a wide range radiation detector whose sensitivity for detecting high energy region radiations is further enhanced.

Furthermore, according to the fifth aspect of the present invention, since traveling directions of radiations into the detection part thereof are parallel to the longer sides of the semiconductor elements thereof, the paths of the radiations incident on the detection part are longer. Consequently, there can be provided a wide range radiation detector whose sensitivity for detecting high energy region radiations is further enhanced.

Furthermore, according to the sixth aspect of the present invention, since the semiconductor elements are respectively wired to be parallel to each other so that output signals from them are added together, there can be provided a wide range radiation detector capable of detecting the energy distributions and the dose rates of radiations surely including high energy region radiations. Besides, since the semiconductor elements are simply layered on each other and wired in parallel, the sensitivity to high energy region radiations can be improved with the same numbers of preamplifiers and main amplifiers as those of the conventional wide range radiation detector, and further costs can be reduced.

Furthermore, according to the seventh aspect of the present invention, since there is provided a comparison part for calculating determination values corresponding to cesium-134 and cesium-137 on added output signals from semiconductor elements and comparing both of the determination values, the comparison of cesium-134 and cesium-137 can be performed highly sensitively. Consequently, there can be provided a wide range radiation detector having the improved detection sensitivity of the burn-up of nuclear fuel.

Furthermore, according to the eighth aspect of the present invention, since there is provided a positron detecting part for extracting the signals of radiations having the energy of 511 keV out of added output signals from semiconductor elements, the radiations having the energy of 511 keV can be extracted highly sensitively. Consequently, there can be provided a wide range radiation detector having the improved detection sensitivity of positrons.

Furthermore, according to the ninth aspect of the present invention, since there is provided a determination part for calculating determination values corresponding to argon-41 on added output signals from emiconductor elements, the determination of argon-41 can be performed highly sensitively. Consequently, there can be provided a wide range radiation detector having the improved detection sensitivity of the activation degrees of argon.

Furthermore, according to the tenth aspect of the present invention, since there is provided cathode electrodes, formed as resistive electrodes, on the respective radiation incidence planes of semiconductor elements, position detecting parts connected to the semiconductor elements respectively for detecting the incidence positions of the radiations in the resistive electrodes by comparing first output pulses generated by the radiations and detected at both the ends of the resistive electrodes and second output pulses generated by the radiations and detected at the anode electrodes of the semiconductor elements, and a radiation position detecting part for detecting the incidence positions of the radiations in the detection part of radiations on signals from the position detecting parts, there can be provided a wide range radiation detector capable of detecting the incident positions of high energy region radiations in the detection part thereof.

Furthermore, according to the eleventh aspect of the present invention, since a plurality of semiconductor elements are layered on each other through a gas having a small atomic number or a vacuum, and the sums of charges generated in the respective semiconductor elements are outputted, regions sensitive to radiations are increased and interactions with something other than semiconductor elements are decreased. Consequently, sensitivity to high energy region radiations is enhanced.

Furthermore, according to the twelfth aspect of the present invention, since pulses having short rise time are discriminated among output pulses of semiconductor elements to be taken out, only the pulses from which charge collection is perfectly performed can be taken out. Consequently, energy resolution is improved, and sensitivity to high energy region radiations is enhanced.

Furthermore, according to the thirteenth aspect of the present invention, since the thicknesses of semiconductor elements are about mean drifting length of a charge carrier having a smaller mobility between charge carriers, the efficiency of charge collection is improved. Consequently, the efficiency of detection is improved.

Furthermore, according to the fourteenth aspect of the present invention, since directions of electric fields imposed on layered semiconductor elements are changed alternately between positive and negative polarities, no electric fields are imposed on insulating materials between the semiconductor elements to reduce total electrostatic capacity. Consequently, the energy resolution thereof is improved.

Furthermore, according to the fifteenth aspect of the present invention, since spaces between semiconductor elements are removed completely and only electrodes are put between the semiconductor elements, non-sensitive portions between semiconductor elements are completely eliminated. Consequently, sensitivity to high energy radiations is improved.

Furthermore, according to the sixteenth aspect of the present invention, since the shapes of layered semiconductor elements are formed as coaxial cylinders, the paths of radiations in the semiconductor elements are long if the radiations enter the elements along the longer sides of the elements, and secondary radiations produced by Compton scattering or the like become easier to be re-detected. Consequently, sensitivity to high energy radiations is improved.

What is claimed is:

1. A wide range radiation detector comprising:
   a detection means, composed of a layered plurality of semiconductor elements, for absorbing and converting energy of incident radiation into electric signals; and
   a comparison means for calculating determination values corresponding to cesium-134 and cesium-137 on added output signals from said semiconductor elements and comparing both the determination values.

2. The wide range radiation detector according to claim 1, further comprising an insulating membrane located between semiconductor elements in the layered plurality of semiconductor elements.

3. The wide range radiation detector according to claim 1, further comprising an absorption material for absorbing radiation traveling into said detection means having an energy level which contributes to choke phenomena.

4. The wide range radiation detector according to claim 1, further comprising a reflecting material, located behind said detection means, for reflecting radiation having an energy high enough to cause said radiation to pass through said detection means.

5. The wide range radiation detector according to claim 1, wherein said incident radiation has a traveling path which is parallel to longer sides of said semiconductor elements.

6. The wide range radiation detector according to claim 1, wherein said plurality of semiconductor elements are wired in parallel with each other so that output signals from said plurality of semiconductor elements are added.

7. The wide range radiation detector according to claim 6, further comprises a positron detecting part for extracting signals of radiations having energy of 511 keV out of the added output signals from said semiconductor elements.

8. The wide range radiation detector according to claim 6, further comprises a determination part for calculating determination values corresponding to argon-41 on the added output signals from said semiconductor elements.

9. A wide range radiation detector comprising:
   a detection means comprised of a layered plurality of semiconductor elements for absorbing and converting energy of incident radiation into electric signals, wherein said layered plurality of semiconductor elements are shaped as coaxial cylinders;
   a plurality of electrodes arranged physically contiguous with said semiconductor elements, wherein electrodes which have a same polarity are arranged so that the electric field directions inside adjacent semiconductor elements are opposite to each other; and
   an adder for summing output signals of said layered plurality of semiconductor elements.

10. A wide range radiation detector, comprising; a detector structure composed of a plurality of semiconductor elements, layered in three dimensions, for absorbing and converting energy of incident radiation into electric signals, and outputting said electric signals, wherein facing sides of said plurality of semiconductor elements have insulating membranes therebetween.

* * * * *